United States Patent
Cetin et al.

(10) Patent No.: US 7,884,672 B1
(45) Date of Patent: Feb. 8, 2011

(54) OPERATIONAL AMPLIFIER AND METHOD FOR AMPLIFYING A SIGNAL WITH SHARED COMPENSATION COMPONENTS

(75) Inventors: Joseph A. Cetin, San Diego, CA (US); Matthew D. Sienko, La Jolla, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 348 days.

(21) Appl. No.: 11/592,075

(22) Filed: Nov. 1, 2006

(51) Int. Cl.
*H03F 3/45* (2006.01)

(52) U.S. Cl. .................. 330/258; 330/254; 330/260; 330/271; 330/264

(58) Field of Classification Search .......... 330/258, 330/254, 253, 260, 269, 271, 264
See application file for complete search history.

(56) References Cited

U.S. PATENT DOCUMENTS

| | | |
|---|---|---|
| 4,051,352 A | 9/1977 | Eichelberger et al. |
| 4,940,909 A | 7/1990 | Mulder et al. |
| 5,204,663 A | 4/1993 | Lee |
| 5,237,699 A | 8/1993 | Little et al. |
| 5,241,224 A | 8/1993 | Pedersen et al. |
| 5,268,598 A | 12/1993 | Pedersen et al. |
| 5,287,017 A | 2/1994 | Narasimhan et al. |
| 5,364,108 A | 11/1994 | Esnouf |
| 5,384,499 A | 1/1995 | Pedersen et al. |
| 5,386,155 A | 1/1995 | Steele et al. |
| 5,426,744 A | 6/1995 | Sawase et al. |
| 5,511,211 A | 4/1996 | Akao et al. |
| 5,548,228 A | 8/1996 | Madurawe |
| 5,548,552 A | 8/1996 | Madurawe |
| 5,550,842 A | 8/1996 | Tran |
| 5,557,217 A | 9/1996 | Pedersen |
| 5,572,148 A | 11/1996 | Lytle et al. |
| 5,594,367 A | 1/1997 | Trimberger et al. |
| 5,598,108 A | 1/1997 | Pedersen et al. |
| 5,603,043 A | 2/1997 | Taylor et al. |
| 5,608,337 A | 3/1997 | Hendricks et al. |
| 5,625,563 A | 4/1997 | Rostoker et al. |
| 5,752,063 A | 5/1998 | DeRoo et al. |

(Continued)

FOREIGN PATENT DOCUMENTS

EP 0420388 A2 4/1991

(Continued)

OTHER PUBLICATIONS

USPTO Notice of Allowance for U.S. Appl. No. 09/605,325 dated Feb. 11, 2005; 4 pages.

(Continued)

*Primary Examiner*—Michael B Shingleton (57) ABSTRACT

An operational amplifier and a method for amplifying a signal. Embodiments provide a convenient and effective mechanism for reducing die area, design time and design verification time by sharing compensation components between the common-mode and differential feedback networks of the operational amplifier. As such, fewer compensation components are required, thereby reducing component die area. Additionally, given that the compensation components are shared between the common-mode and differential feedback networks, the feedback networks can be stabilized together with fewer compensation components to specify and verify, thereby reducing design and design verification time. Further, embodiments provide a compensation component coupling which does not couple directly to virtual ground, thereby reducing the noise of the operational amplifier.

20 Claims, 4 Drawing Sheets

U.S. PATENT DOCUMENTS

| | | | |
|---|---|---|---|
| 5,757,207 | A | 5/1998 | Lytle et al. |
| 5,760,607 | A | 6/1998 | Leeds et al. |
| 5,798,656 | A | 8/1998 | Kean |
| 5,864,486 | A | 1/1999 | Deming et al. |
| 5,990,717 | A | 11/1999 | Partovi et al. |
| 6,005,806 | A | 12/1999 | Madurawe et al. |
| 6,023,570 | A | 2/2000 | Tang et al. |
| 6,025,737 | A | 2/2000 | Patel et al. |
| 6,389,321 | B2 | 5/2002 | Tang et al. |
| 6,401,224 | B1 | 6/2002 | Schoniger et al. |
| 6,446,242 | B1 | 9/2002 | Lien et al. |
| 6,448,820 | B1 | 9/2002 | Wang et al. |
| 6,542,034 | B2 * | 4/2003 | Tomasini et al. ............ 330/264 |
| 6,912,601 | B1 | 6/2005 | Moore ......................... 710/10 |

FOREIGN PATENT DOCUMENTS

| | | |
|---|---|---|
| EP | 0455414 A2 | 11/1991 |
| EP | 0510815 A2 | 10/1992 |

OTHER PUBLICATIONS

USPTO Final Rejection for U.S. Appl. No. 09/605,325 dated Sep. 8, 2004; 11 pages.

USPTO Non-Final Rejection for U.S. Appl. No. 09/605,325 dated Feb. 17, 2004; 9 pages.

USPTO Non-Final Rejection for U.S. Appl. No. 09/605,325 dated Sep. 22, 2003; 8 pages.

USPTO Non-Final Rejection for U.S. Appl. No. 09/605,325 dated Apr. 8, 2003; 8 pages.

USPTO Non-Final Rejection for U.S. Appl. No. 09/605,325 dated Nov. 22, 2002; 9 pages.

Jesse Jenkins, "Microcontroller Accelleration," 1993 IEEE, pp. 416-424; 9 pages.

Shubat et al., "A Family of User-Programmable Peripherals with a Functional Unit Architecture," 1992 IEEE, pp. 515-529; 15 pages.

Shubat et al., "A User Programmable Peripherals with Functional Unit Architecture," pp. 23-24; 2 pages.

Patel et al., "A 10ns, 4000 Gate, 160 Pin CMOS EPLD Developed on a 0.8um Process," 1993 IEEE, pp. 7.6.1-7.6.5; 5 pages.

Kopec et al., "Obtaining 70MHz Performance in the MAX Architecture," May 1991, pp. 69-74; 4 pages.

Ohsaki et al., "SIPPOS (Single Poly Pure CMOS) EEPROM Embedded FPGA by News Ring Interconnection and Highway Path," 1994 IEEE, pp. 9.4.1-9.4.4; 4 pages.

D.E. Smith, "Intel's FLEXlogic FPGA Architecture," 1993 IEEE, pp. 378-384; 7 pages.

Tsuda, "Dual and Fail-Safe Redundancy for Static Mask-ROMs and PLAs," 1993 IEEE, pp. 57-66; 10 pages.

Shama et al., "A 0.5um Technology for Advanced Microcontroller Applications," 1994 IEEE, pp. 67-68; 2 pages.

Muroga et al., "A Large Scale FPGA with 10K Core Cells with CMOS 0.8um 3-Layered Metal Process," 1991 IEEE, pp. 6.4.1-6.4.4; 4 pages.

Frake et al., "Session 15: High-Speed Digital Circuits, FAM 15:5: A 9ns, Low Standby Power CMOS PLD with a Single-Poly EPROM Cell," Feb. 1989, pp. 344-346; 3 pages.

Julie Krueger, "Integrated Circuits for Smart Cards," October through Dec. 1995, pp. 1168-1170; 3 pages.

Matsumoto et al., "1.5V High Speed Read Operation and Low Power Consumption Circuit Technology for EPROM and Flash-EEPROM," 1993 IEEE, pp. 25.41-25.4.4; 4 pages.

Chris Jay, "PSD301 Programmable Peripheral with Memory for Microcontroller and Embedded Microprocessor Applications," Jul./Aug. 1991; 9 pages.

Goodenough, "Analog Counterparts of FPGAs Ease System Design," Oct. 1994, pp. 63-72; 10 pages.

Fukushima et al., "A Microcontroller Embedded with 4Kbit Ferroelectric Non-Volatile Memory," 1996 IEEE, pp. 46-47; 2 pages.

Ikeda et al., "Single Chip Microcontroller with Internal EPROMs," National Technical Report, vol. 36, No. 3, Jun. 1990, pp. 295-302; 8 pages.

Charles Melear, "Integrated Memory Elements on Microcontroller Devices," WESCON/94, 'Idea/Microelectronics,' Sep. 1994, pp. 507-514; 8 pages.

* cited by examiner

OPERATIONAL AMPLIFIER AND METHOD FOR AMPLIFYING A SIGNAL WITH SHARED COMPENSATION COMPONENTS

BACKGROUND OF THE INVENTION

Fully differential operational amplifiers (op amps) require stable differential and common-mode operation. As such, modern op amps are designed with separate differential and common-mode feedback compensation networks to stabilize both differential and common-mode operation of the op amp. The compensation in each compensation network is provided by capacitors, where the capacitors either perform differential or common-mode compensation.

Figure 1:
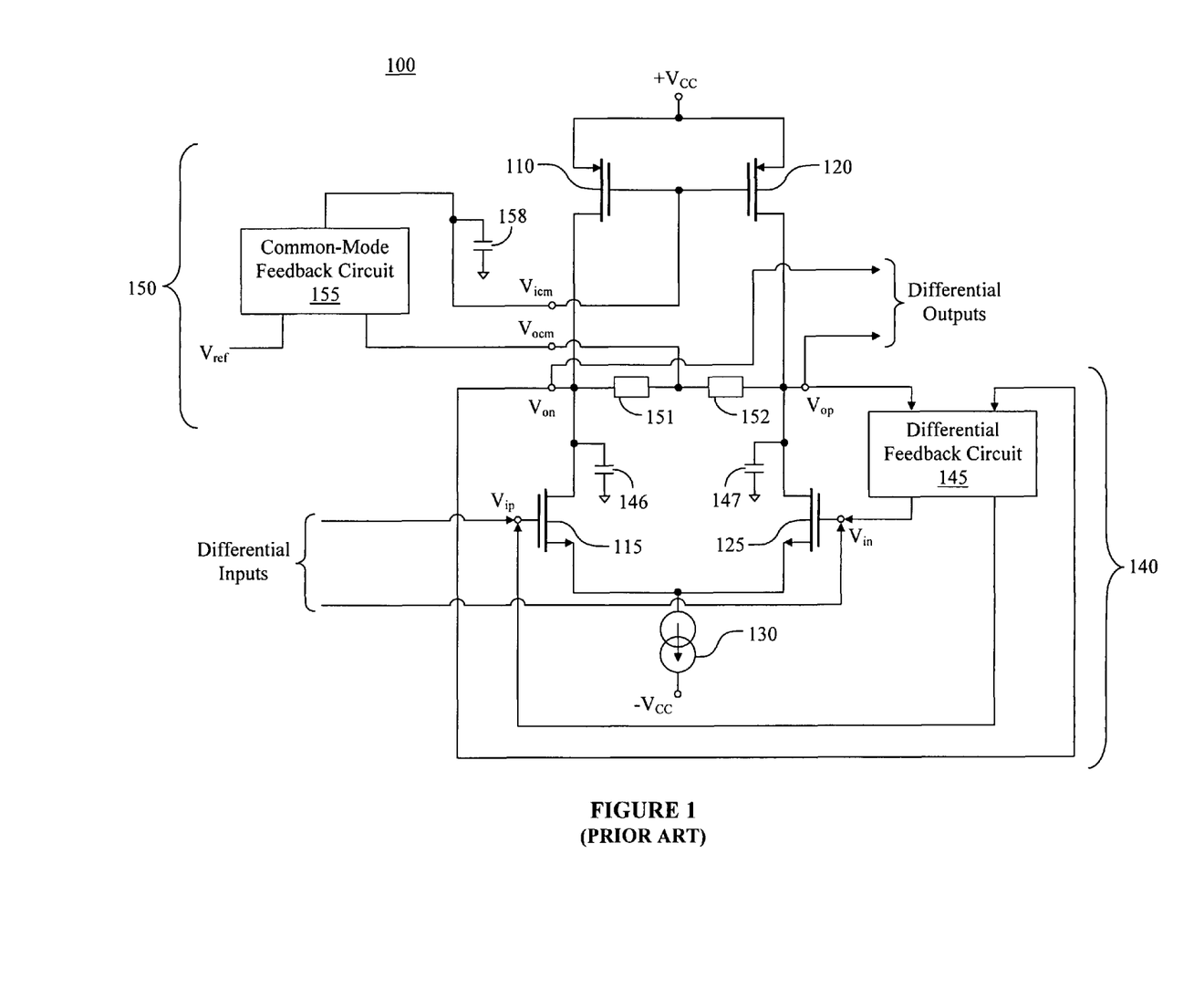
FIG. 1 shows a conventional operational amplifier.

FIG. 1 shows conventional operational amplifier 100. Op amp 100 operates between $+V_{CC}$ and $-V_{CC}$ rails, where differential signals fed to differential inputs $V_{ip}$ and $V_{in}$ are amplified and output at differential outputs $V_{op}$ and $V_{on}$ during differential operation. Amplification of the differential signals is provided by flowing current from the $+V_{CC}$ rail, through the individual cascoded transistor pairs (e.g., pmos transistor 110 and nmos transistor 115, and pmos transistor 120 and nmos transistor 125) and current sink 130, and into the $-V_{cc}$ rail. Differential feedback is provided by differential feedback loop 140, which feeds back voltages from the differential outputs to the differential inputs via differential feedback circuit 145.

Common-mode feedback loop 150 is used to set the operating point of op amp 100 during common-mode operation. Resistors 151 and 152 provide a voltage divider for generating an average voltage (e.g., an average of the differential outputs) at common-mode output $V_{ocm}$, where the average voltage is fed back to the common-mode feedback circuit 155 for comparison with a reference voltage $V_{ref}$ also fed to circuit 155. In response to the comparison, circuit 155 will generate a common-mode control signal fed to common-mode input $V_{icm}$. The voltage at $V_{icm}$ is used to adjust the bias of pmos transistors 110 and 120, thereby shifting the voltage at the differential outputs to set the operating point of op amp 100.

As shown in FIG. 1, differential feedback loop 140 and separate common-mode feedback loop 150 utilize separate compensation capacitors to stabilize both modes of operation. For example, differential feedback loop 140 uses compensation capacitors 146 and 147 to stabilize differential operation, while common-mode feedback loop 150 uses compensation capacitor 158 to stabilize common-mode operation. Given the large area required on integrated circuit dies to implement capacitors, the compensation networks of op amp 100 require large die area, thereby limiting use in integrated circuits with smaller allotted die areas. Additionally, the separate differential and common-mode compensation networks of op amp 100 increase the design and design verification time as both networks must be individually optimized. Further, given that both compensation networks couple to virtual ground as shown in FIG. 1, the noise of op amp 100 is increased, thereby limiting use in designs requiring low noise.

SUMMARY OF THE INVENTION

Accordingly, a need exists for an operational amplifier with compensation components occupying a reduced die area. Additionally, a need exists for an operational amplifier with compensation networks requiring reduced design and design verification time. Further, a need exists for an operational amplifier with compensation components producing lower noise. Embodiments of the present invention provide novel solutions to these needs and others as described below.

Embodiments of the present invention are directed to an operational amplifier and a method for amplifying a signal. More specifically, embodiments provide a convenient and effective mechanism for reducing die area, design time and design verification time by sharing compensation components between the common-mode and differential feedback networks of the operational amplifier. As such, fewer compensation components are required, thereby reducing component die area. Additionally, given that the compensation components are shared between the common-mode and differential feedback networks, the feedback networks can be stabilized together with fewer compensation components to specify and verify, thereby reducing design and design verification time. Further, embodiments provide a compensation component coupling which does not couple directly to virtual ground, thereby reducing the noise of the operational amplifier.

In one embodiment, an operational amplifier circuit includes amplifier circuitry for amplifying a differential signal, wherein the amplifier circuitry is operable to generate a differential output signal. A differential feedback network is coupled to the amplifier circuitry and operable to provide differential feedback compensation therein, the differential feedback network including compensation elements. The operational amplifier circuitry also includes a common-mode feedback network coupled to the amplifier circuitry and operable to provide common-mode feedback compensation therein, the common-mode feedback network sharing the compensation elements of the differential feedback network.

In another embodiment, an operational amplifier includes amplifier circuitry, a common-mode feedback loop coupled to the amplifier circuitry and for controlling common-mode operation of the operational amplifier, the common-mode operation comprising an adjustment of an operating point of the operational amplifier. A differential feedback loop is coupled to the amplifier circuitry and for controlling differential operation of the operational amplifier, the differential operation comprising an amplification of a differential signal input to the operational amplifier. The common-mode and differential feedback loops are coupled to at least one common compensation component operable to improve stability of both the common-mode and differential operation of the operational amplifier.

And in yet another embodiment, a method for amplifying a differential signal includes controlling differential operation of an operational amplifier using a differential feedback loop, the differential operation including an amplification of the differential signal input to the operational amplifier. Common-mode operation of the operational amplifier is controlled using a common-mode feedback loop, the common-mode operation including an adjustment of an operating point of the operational amplifier. The differential and common-mode operation of the operational amplifier is stabilized using shared compensation components coupled to the differential and common-mode feedback loops.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the Invention

Figure 2:
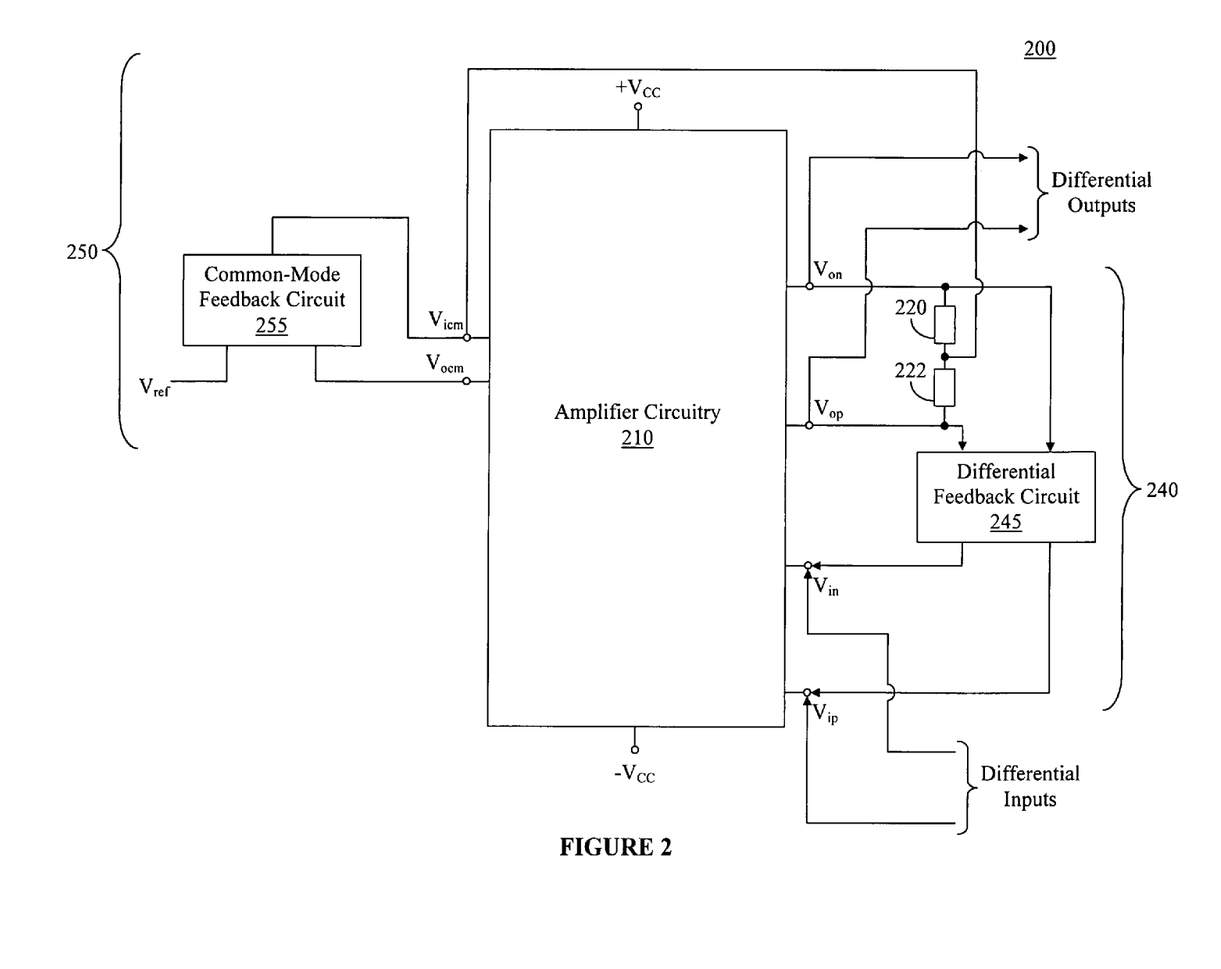
FIG. 2 shows an exemplary operational amplifier that shares compensation components between the differential and common-mode feedback networks in accordance with a first embodiment of the present invention.

FIG. 2 shows exemplary operational amplifier (op amp) 200 that shares compensation components between the differential and common-mode feedback networks in accordance with a first embodiment of the present invention. As shown in FIG. 2, operational amplifier 200 comprises amplifier circuitry for amplifying differential signals (e.g., analog, digital, etc.) fed to differential inputs $V_{ip}$ and $V_{in}$, where the amplified signal may be generated at differential outputs $V_{op}$ and $V_{on}$. The amplification of differential signals may comprise a differential operating mode of op amp 200 requiring stabilization, where differential feedback loop 240 (e.g., comprising differential feedback circuit 245) provides differential feedback compensation to stabilize op amp 200 during differential operation. In one embodiment, circuit 245 may implement a feedback factor β such that $$\beta = \frac{V_{ip} - V_{in}}{V_{op} - V_{on}}.$$

Compensation is provided by compensation components 220 and 222, which are coupled in series across the differential outputs $V_{op}$ and $V_{on}$. In one embodiment, compensation components 220 and 222 may comprise capacitors (e.g., nonpolarized, polarized, etc.), a combination of capacitors and resistors, or other components (e.g., passive, active, etc.) or combinations of components.

Common-mode feedback loop 250 is used to set the operating point of op amp 200 during common-mode operation. An operating point (e.g., an average of the differential outputs) of op amp 200 may be fed to the common-mode output $V_{ocm}$ such that common-mode feedback circuit 255 (e.g., comprising a comparator, etc.) may compare the operating point with a reference voltage $V_{ref}$ also fed to circuit 255. Vref may be in internally generated by op amp 200, externally generated and fed to op amp 200, etc. In response to the comparison, circuit 255 will generate a common-mode control signal fed to amplifier circuitry 210 via common-mode input $V_{icm}$. The voltage at $V_{icm}$ may then adjust an operating point of op amp 200 (e.g., by adjusting the bias of transistors within amplifier circuitry 210, etc.), which may comprise a common-mode operating mode of op amp 200 requiring stabilization. Common-mode feedback loop 250 provides common-mode feedback compensation to stabilize op amp 200 during common-mode operation, where compensation is provided by compensation components 220 and 222 coupled to common-mode input $V_{icm}$.

As shown in FIG. 2, the common-mode and differential feedback networks (e.g., loops 240 and 250) share compensation components (e.g., 220 and 222), thereby reducing the number of components required to stabilize the two operation modes in comparison to conventional solutions (e.g., requiring at least three components as shown in FIG. 1). As such, the die area required to implement op amp 200, and more specifically compensation components 220 and 222, is reduced from that of op amp 100 as shown in FIG. 1. Additionally, sharing of the components between feedback networks allows them to be stabilized in a single operation with fewer components to account for, thereby reducing design and design verification time. Further, given that the compensation configuration as depicted in FIG. 2 does not require direct coupling to virtual ground (e.g., as compared with capacitors 146, 147 and 158 of FIG. 1), op amp 200 is able to operate with lower noise than conventional solutions.

Where compensation components 220 and 222 are capacitors coupled in series, their values may be calculated using equations, modeling or a combination of the two. For example, the compensation capacitor values ($C_C$) may be estimated by the equation $$C_c = \frac{g_m}{G_{bw}},$$

where $g_m$ is the transconductance of a coupled input device (e.g., transistor, etc.) and $G_{bw}$ is the gain bandwidth product of the op amp (e.g., 200). In other embodiments, other equations may be used (e.g., to account for changes in amplifier circuitry 210, circuit 245, circuit 255, etc.). The compensation components may then be modeled using the estimated values as a starting point to more accurately determine their values (e.g., taking into account second, third, etc. order effects on $G_{bw}$).

Amplifier circuitry 210 may comprise at least one input stage, gain stage, bias stage and output stage for amplifying signals input to circuitry 210. Additionally, it should be appreciated that circuitry 210 may comprise additional active and/or passive circuitry for interfacing the staged circuitry, where such additional circuitry may comprise current mirrors, current sources/sinks, voltage dividers, etc.

Although FIG. 2 depicts exemplary op amp 200 with specific inputs and/or outputs to amplifier circuitry 200, it should be appreciated that other inputs and/or outputs (e.g., for external compensation pins, balance, etc.) may be used in other embodiments in addition to or in place of those depicted in FIG. 2. Additionally, although only two compensation components (e.g., 220 and 222) are depicted in FIG. 2, it should be appreciated that a larger or smaller number may be used to compensate the common-mode and/or differential feedback networks in other embodiments. Further, although circuits 245 and 255 are depicted as single units in FIG. 2, it should be appreciated that circuits 245 and/or 255 may be implemented using more than one circuit in other embodiments. And in another embodiment, circuits 245 and 255 may share at least one non-compensation component (e.g., in addition to at least one compensation component).

Figure 3:
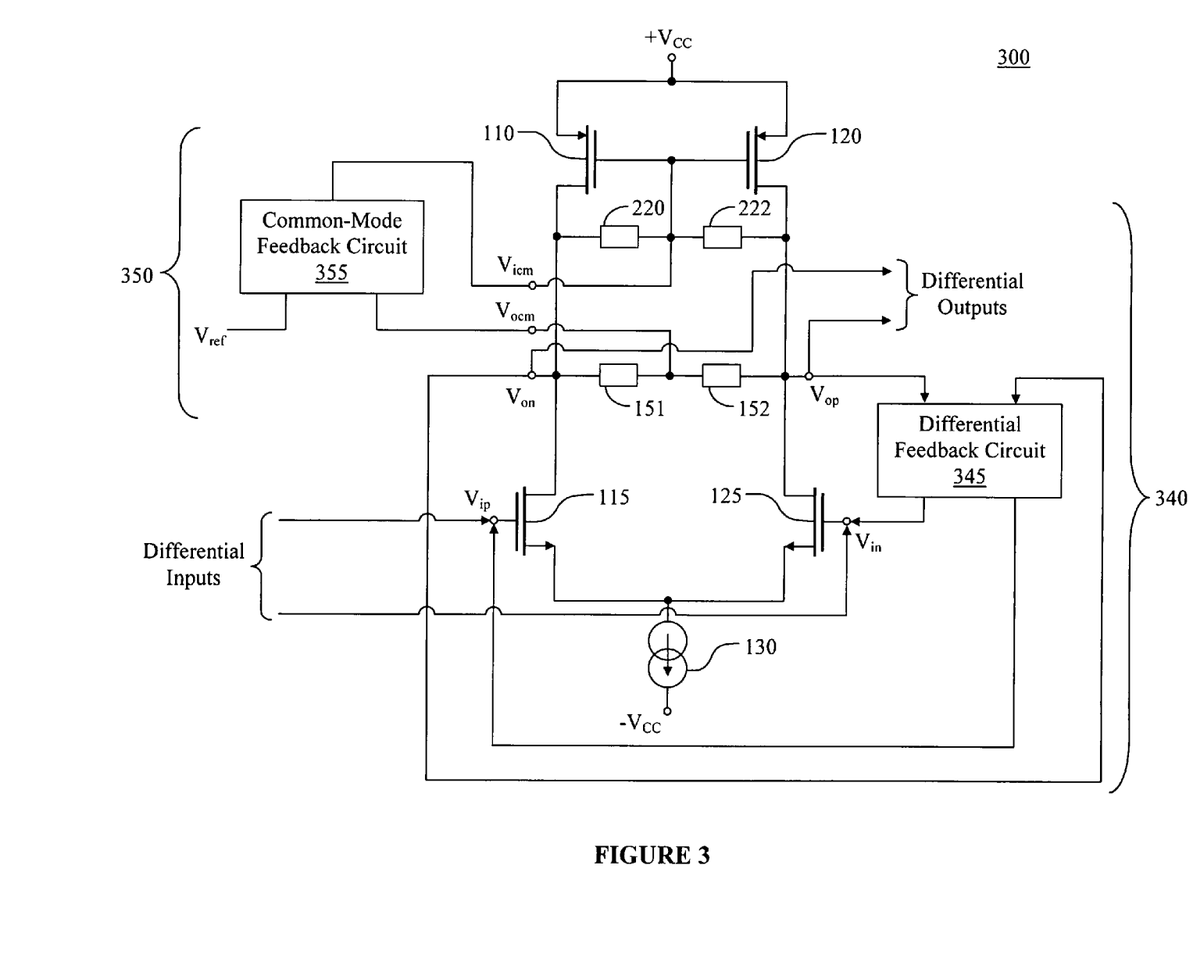
FIG. 3 shows an exemplary operational amplifier that shares compensation components between the differential and common-mode feedback networks in accordance with a second embodiment of the present invention.

FIG. 3 shows exemplary operational amplifier 300 that shares compensation components between the differential and common-mode feedback networks in accordance with a second embodiment of the present invention. As shown in FIG. 3, op amp 300 may perform both differential operation (e.g., amplifying a differential signal fed to differential inputs $V_{ip}$ and $V_{in}$ to generate an amplified signal at differential outputs $V_{op}$ and $V_{on}$) and common-mode operation (e.g., setting the operating point of op amp 300) similar to that of op amp 200 discussed above. Amplification of the differential signals is provided by flowing current from the $+V_{CC}$ rail, through the individual cascoded transistor pairs dedicated to a respective differential input (e.g., pmos transistor 110 and nmos transistor 115 dedicated to $V_{ip}$, and pmos transistor 120 and nmos transistor 125 dedicated to $V_{in}$) and current sink 130, and into the $-V_{CC}$ rail.

Differential feedback loop 340 provides differential feedback compensation to stabilize op amp 200 during differential operation. Similar to differential feedback loop 240 of FIG. 2, differential feedback loop 340 feeds back signals from the differential outputs (e.g., $V_{op}$ and $V_{on}$) to the differential inputs (e.g., $V_{ip}$ and $V_{in}$) via differential feedback circuit 345. In one embodiment, circuit 345 may comprise identical circuitry of circuit 245 of FIG. 2. In another embodiment, the circuitry of circuit 345 may differ from that of circuit 245 to accommodate for other circuitry changes of op amp 300 with respect to op amp 200 of FIG. 2. Additionally, compensation is provided by compensation components 220 and 222 similar to the compensation configuration discussed above with respect to FIG. 2.

Common-mode feedback loop 350 provides common-mode feedback compensation to stabilize op amp 300 during common-mode operation, where compensation is provided by compensation components 220 and 222 coupled to common-mode input $V_{icm}$ (e.g., as discussed above with respect to op amp 200 of FIG. 2). Similar to common-mode feedback loop 250 of FIG. 2, common-mode feedback circuit 355 compares an operating point of op amp 300 with a reference voltage $V_{ref}$ to generate a common-mode control signal fed to $V_{icm}$ for adjusting the operating point (e.g., by changing the bias of transistors 110 and 120) of op amp 300. In one embodiment, circuit 355 may comprise identical circuitry of circuit 255 of FIG. 2. In another embodiment, the circuitry of circuit 355 may differ from that of circuit 255 to accommodate for other circuitry changes of op amp 300 with respect to op amp 200 of FIG. 2.

The operating point may be sensed using resistive components 151 and 152 coupled in series to form a voltage divider, where a divided voltage is generated at the common node shared by both resistive components 151 and 152. Resistive components may comprise any resistive component (e.g., a resistor, transistor, etc.), voltage dividing component, voltage generating component (e.g., a diode with substantially constant voltage drop, etc.), or the like.

As shown in FIG. 3, the common-mode and differential feedback networks (e.g., loops 340 and 350) share compensation components (e.g., 220 and 222), thereby providing the same advantages (e.g., smaller die area, reduced design and design verification time, lower noise, etc.) over conventional solutions as discussed above with respect to op amp 200 of FIG. 2. Additionally, the values of components 220 and 222 may be calculated as discussed above with respect to FIG. 2.

Although FIG. 3 depicts exemplary op amp 300 with specific inputs and/or outputs, it should be appreciated that other inputs and/or outputs (e.g., for external compensation pins, balance, etc.) may be used in other embodiments in addition to or in place of those depicted in FIG. 3. Additionally, although only two compensation components (e.g., 220 and 222) are depicted in FIG. 3, it should be appreciated that a larger or smaller number may be used to compensate the common-mode and/or differential feedback networks in other embodiments. Further, although circuits 345 and 355 are depicted as single units in FIG. 3, it should be appreciated that circuits 345 and/or 355 may be implemented using more than one circuit in other embodiments. And in another embodiment, circuits 345 and 355 may share at least one non-compensation component (e.g., in addition to at least one compensation component). Additionally, although FIG. 3 depicts transistors 110-125 as pmos and nmos transistors, it should be appreciated that other types of transistors may be used in other embodiments. Further, although FIG. 3 depicts op amp 300 with specific circuitry to amplify differential signals and set an operating point of the op amp, it should be appreciated that other designs may be used in other embodiments.

Figure 4:
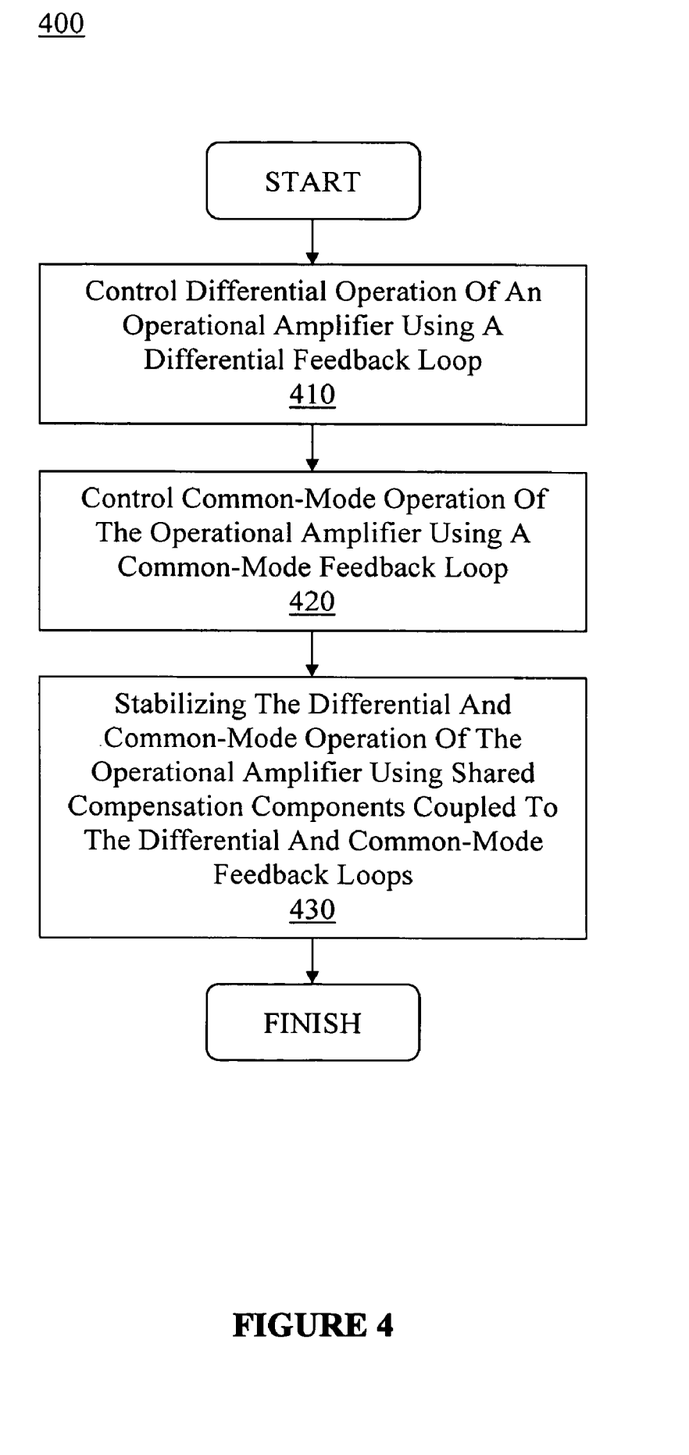
FIG. 4 shows a process for amplifying a signal in accordance with one embodiment of the present invention.

FIG. 4 shows process 400 for amplifying a signal in accordance with one embodiment of the present invention. As shown in FIG. 4, step 410 involves controlling differential operation of an operational amplifier (e.g., 200, 300, etc.) using a differential feedback loop (e.g., 240, 340, etc.). The differential operation may comprise amplifying differential signals fed to the op amp (e.g., to differential inputs) to generate amplified differential signals (e.g., at differential outputs). Additionally, the differential feedback loop may comprise one or more differential feedback circuits for controlling the amplification (e.g., by implementing a feedback factor, etc.) and providing feedback compensation for the control system.

Step 420 involves controlling common-mode operation of an operational amplifier (e.g., 200, 300, etc.) using a common-mode feedback loop (e.g., 250, 350, etc.). The common-mode operation may comprises adjusting and/or setting an operating point (e.g., an average of differential outputs) of the op amp. Additionally, the common-mode feedback loop may comprise one or more common-mode feedback circuits for controlling the operation point adjustment and/or setting (e.g., to generate a common-mode control signal in response to a comparison of a current operating point with a reference voltage) and providing feedback compensation for the control system.

Step 430 involves stabilizing the differential and common-mode operation of the operational amplifier (e.g., 200, 300, etc.) using shared compensation components (e.g., 220 and 222 of FIGS. 2 and 3) coupled to the differential and common-mode feedback loops (e.g., 245/345 and 255/355, respectively). In one embodiment, the compensation components (e.g., 220 and/or 222) may comprise capacitors (e.g., non-polarized, polarized, etc.), a combination of capacitors and resistors, or other components (e.g., passive, active, etc.) or combinations of components. Sharing of the compensation components between differential and common-mode feedback networks enables the use of fewer parts over conventional solutions as discussed above with respect to FIG. 2, thereby reducing the die area needed to implement the op amp. Additionally, sharing of the components between feedback networks allows them to be stabilized in a single operation with fewer components to account for, thereby reducing design and design verification time. Further, sharing compensation components enables a component coupling that avoids direct connection to a ground (e.g., virtual ground, etc.), thereby reducing the noise of the op amp over conventional solutions.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. An operational amplifier circuit comprising:
    amplifier circuitry for amplifying a differential signal, wherein said amplifier circuitry is operable to generate a differential output signal;
    a differential feedback network coupled to said amplifier circuitry and operable to provide differential feedback compensation therein, said differential feedback network comprising compensation elements; and
    a common-mode feedback network coupled to said amplifier circuitry and operable to provide common-mode feedback compensation therein, said common-mode feedback network sharing said compensation elements of said differential feedback network.

2. The operational amplifier circuit of claim 1, wherein said compensation elements are capacitors.

3. The operational amplifier circuit of claim 1, wherein said compensation elements comprise a pair of capacitors.

4. The operational amplifier circuit of claim 1, wherein said amplifier circuitry comprises:
    first and second transistors coupled in series; and
    third and fourth transistors coupled in series and also coupled in parallel to said first and second transistors.

5. The operational amplifier circuit of claim 4, wherein said compensation elements are coupled in series to each other forming a component with a first and second end, and wherein said component is coupled between said first and second transistors on said first end and coupled between said third and fourth transistors on said second end.

6. The operational amplifier circuit of claim 1, wherein said compensation elements are coupled in series to each other and coupled to nodes of said differential feedback network, and further wherein a center node of a series coupling of said compensation elements is coupled to a node of said common-mode feedback network.

7. The operational amplifier circuit of claim 6, wherein said compensation elements are a pair of capacitors.

8. An operational amplifier comprising: amplifier circuitry;
    a common-mode feedback loop coupled to said amplifier circuitry and for controlling common-mode operation of said operational amplifier, said common-mode operation comprising an adjustment of an operating point of said operational amplifier;
    a differential feedback loop coupled to said amplifier circuitry and for controlling differential operation of said operational amplifier, said differential operation comprising an amplification of a differential signal input to said operational amplifier; and
    wherein said common-mode and differential feedback loops are coupled to at least one common compensation component operable to improve stability of both said common-mode and differential operation of said operational amplifier.

9. The operational amplifier of claim 8, wherein said at least one compensation component comprises a capacitor.

10. The operational amplifier of claim 8, wherein said amplifier circuitry comprises a voltage divider circuit coupled to a first and second differential output of said operational amplifier and for generating a divided voltage between said first and second differential outputs, wherein said common-mode feedback loop comprises a common-mode feedback circuit for comparing a reference voltage with said divided voltage and for generating a common-mode control signal in response to a comparison of said reference and divided voltages, said common-mode control signal fed to a common-mode input of said operational amplifier for controlling said common-mode operation of said operational amplifier.

11. The operational amplifier of claim 10, wherein said voltage divider circuit comprises a first and second resistive element, said first resistive element coupled between said first differential output and a common node, said second resistive element coupled between said second differential output and said common node, and wherein said first and second resistive elements are operable to generate said divided voltage at said common node.

12. The operational amplifier of claim 8, wherein said differential feedback loop comprises a differential feedback circuit for implementing a feedback factor comprising a voltage ratio of a difference in differential inputs to a difference in differential outputs of said operational amplifier.

13. The operational amplifier of claim 8, wherein said at least one compensation component comprises a first compensation component, wherein said first compensation component comprises a first terminal and a second terminal, wherein said first terminal is coupled to a first differential output of said operational amplifier, and wherein said second terminal is coupled to a common-mode input of said operational amplifier.

14. The operational amplifier of claim 8, wherein said at least one compensation component comprises a second compensation component, wherein said second compensation component comprises a third terminal and a fourth terminal, wherein said third terminal is coupled to a second differential output of said operational amplifier, and wherein said fourth terminal is coupled to a common-mode input of said operational amplifier.

15. A method for amplifying a differential signal comprising:
    controlling differential operation of an operational amplifier using a differential feedback loop, said differential operation comprising an amplification of said differential signal input to said operational amplifier;
    controlling common-mode operation of said operational amplifier using a common-mode feedback loop, said common-mode operation comprising an adjustment of an operating point of said operational amplifier; and
    stabilizing said differential and common-mode operation of said operational amplifier using shared compensation components coupled to said differential and common-mode feedback loops.

16. The method of claim 15, wherein said shared compensation components comprise a capacitor.

17. The method of claim 15 further comprising:
generating a divided voltage using a voltage divider circuit of said common-mode feedback loop, wherein said divided voltage has a value between voltages of a first and second differential output of said operational amplifier;
comparing a reference voltage with said divided voltage using a common-mode feedback circuit, wherein said reference voltage and divided voltages are fed to said common-mode feedback circuit; and
in response to a comparison of said reference voltage and said divided voltage, generating a common-mode control signal for controlling said common-mode operation of said operational amplifier.

18. The method of claim 17, wherein said voltage divider circuit comprises a first and second resistive element, said first resistive element coupled between a first differential output of said operational amplifier and a common node, said second resistive element coupled between a second differential output of said operational amplifier and said common node, and wherein said first and second resistive elements are operable to generate said divided voltage at said common node.

19. The method of claim 15, wherein said shared compensation components comprise a first compensation component, wherein said first compensation component comprises a first terminal and a second terminal, wherein said first terminal is coupled to a first differential output of said operational amplifier, and wherein said second terminal is coupled to a common-mode input of said operational amplifier.

20. The method of claim 15, wherein said shared compensation components comprise a second compensation component, wherein said second compensation component comprises a third terminal and a fourth terminal, wherein said third terminal is coupled to a second differential output of said operational amplifier, and wherein said fourth terminal is coupled to a common-mode input of said operational amplifier.

\* \* \* \* \*